(12) United States Patent
Goudarzi et al.

(10) Patent No.: US 10,637,637 B2
(45) Date of Patent: Apr. 28, 2020

(54) FIXING DEAD-ZONE IN CLOCK DATA RECOVERY CIRCUITS

(71) Applicant: QUALCOMM Incorporated, San Diego, CA (US)

(72) Inventors: Hadi Goudarzi, San Diego, CA (US); Jon Boyette, Holly Springs, NC (US); Eskinder Hailu, Cary, NC (US); Julian Puscar, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/261,318

(22) Filed: Jan. 29, 2019

(65) Prior Publication Data

US 2020/0099506 A1    Mar. 26, 2020

Related U.S. Application Data

(60) Provisional application No. 62/735,533, filed on Sep. 24, 2018.

(51) Int. Cl.
*H04L 7/00*    (2006.01)
*H03L 7/085*    (2006.01)
*H03L 7/08*    (2006.01)
*H04L 7/033*    (2006.01)

(52) U.S. Cl.
CPC ............ *H04L 7/0025* (2013.01); *H03L 7/085* (2013.01); *H03L 7/0807* (2013.01); *H04L 7/0087* (2013.01); *H04L 7/0331* (2013.01)

(58) Field of Classification Search
CPC ......... H03L 7/091; H03L 7/0814; H03L 7/07; H03L 7/0807; H03L 7/00; H03L 7/081; H03L 7/0998; H04L 7/0025; H04L 7/033; H04L 7/002; H04L 7/0331; H04L 25/03885; H04L 7/0087
See application file for complete search history.

(56) References Cited

U.S. PATENT DOCUMENTS

| | | | | |
|---|---|---|---|---|
| 8,610,476 B1 * | 12/2013 | Soh | ...................... | H03L 7/0807 327/159 |
| 9,166,605 B2 * | 10/2015 | Bae | ......................... | H03L 7/081 |
| 9,264,219 B1 * | 2/2016 | Kang | ...................... | H03L 7/091 |
| 9,590,640 B1 * | 3/2017 | Hsieh | .................... | H03L 7/0807 |
| 10,367,634 B1 * | 7/2019 | Yu | .......................... | H03L 7/0814 |
| 2010/0322367 A1 * | 12/2010 | Wenske | ............... | H03L 7/0807 375/373 |
| 2018/0219704 A1 * | 8/2018 | Song | ................. | H04L 25/03273 |

* cited by examiner

*Primary Examiner* — Khanh C Tran
(74) *Attorney, Agent, or Firm* — Loza & Loza, LLP/Qualcomm

(57) ABSTRACT

A method for fixing a dead-zone in a clock and data recovery (CDR) circuit is disclosed herein. The CDR circuit includes a CDR block and a phase interpolator, the CDR block is configured to generate phase codes based on signals from a phase detector, and the phase interpolator is configured to adjust a phase of a clock signal based on the phase codes. The method includes waiting for the CDR circuit to lock, reading a first phase code from the CDR block, changing the first phase code by a first amount to obtain a second phase code, and inputting the second phase code to the phase interpolator.

26 Claims, 13 Drawing Sheets

FIXING DEAD-ZONE IN CLOCK DATA RECOVERY CIRCUITS

RELATED APPLICATION

This application claims priority under 35 U.S.C. § 119(e) to U.S. Provisional Application No. 62/735,533 filed on Sep. 24, 2018, the entire specification of which is incorporated herein by reference.

BACKGROUND

Field

Aspects of the present disclosure relate generally to clock data recovery circuits, and more particularly to fixing dead-zone in clock data recovery circuits.

Background

A clock and data recovery (CDR) circuit may be used in a receiver to recover a clock signal from a data signal. The recovered clock signal is used to sample the data signal to recover data in the data signal. Clock data recovery may be used, for example, to recover data in a data signal (e.g., high-speed serial data signal) that is received at the receiver without a separate clock signal.

SUMMARY

The following presents a simplified summary of one or more implementations in order to provide a basic understanding of such implementations. This summary is not an extensive overview of all contemplated implementations and is intended to neither identify key or critical elements of all implementations nor delineate the scope of any or all implementations. Its sole purpose is to present some concepts of one or more implementations in a simplified form as a prelude to the more detailed description that is presented later.

A first aspect relates to a method for fixing a dead-zone in a clock and data recovery (CDR) circuit. The CDR circuit includes a CDR block and a phase interpolator, the CDR block is configured to generate phase codes based on signals from a phase detector, and the phase interpolator is configured to adjust a phase of a clock signal based on the phase codes. The method includes waiting for the CDR circuit to lock, reading a first phase code from the CDR block, changing the first phase code by a first amount to obtain a second phase code, and inputting the second phase code to the phase interpolator.

A second aspect relates to a circuit for fixing a dead-zone in a clock and data recovery (CDR) circuit. The CDR circuit includes a CDR block and a phase interpolator, wherein the CDR block is configured to generate phase codes based on signals from a phase detector, and the phase interpolator is configured to adjust a phase of a clock signal based on the phase codes. The circuit includes a controller and a multiplexer. The multiplexer is configured to selectively couple the CDR block or the controller to the phase interpolator. The controller is configured to instruct the multiplexer to couple the CDR block to the phase interpolator and wait for the CDR circuit to lock, read a first phase code from the CDR block, change the first phase code by a first amount to obtain a second phase code, instruct the multiplexer to couple the controller to the phase interpolator and input the second phase code to the phase interpolator, and instruct the multiplexer to couple the CDR block to the phase interpolator after the second phase code is input to the phase interpolator.

A third aspect relates to a circuit for fixing a dead-zone in a clock and data recovery (CDR) circuit, wherein the CDR includes a CDR block and a phase interpolator. The circuit includes a controller configured to read a first phase code from the CDR block, change the first phase code by an amount to obtain a second phase code, and output the second phase code at an output of the controller. The circuit also includes a multiplexer having a first input coupled to an output of the CDR block, a second input coupled to the output of the controller, and an output coupled to an input of the phase interpolator. The multiplexer is configured to receive a select signal, and couple the output of the CDR block to the input of the phase interpolator or couple the output of the controller to the input of the phase interpolator based on the select signal.

To the accomplishment of the foregoing and related ends, the one or more implementations include the features hereinafter fully described and particularly pointed out in the claims. The following description and the annexed drawings set forth in detail certain illustrative aspects of the one or more implementations. These aspects are indicative, however, of but a few of the various ways in which the principles of various implementations may be employed and the described implementations are intended to include all such aspects and their equivalents.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

A clock data recovery (CDR) circuit may be used in a receiver to recover a clock signal from a data signal received by the receiver, and to sample the data signal using the recovered clock signal to recover data (e.g., data bits) from the data signal. The recovered data may be output to another component in the receiver for further processing.

At the receiver, the data signal is sampled on sampling edges of the recovered clock signal. The sampling edges may include rising edges of the clock signal, falling edges of the clock signal, or both rising and falling edges of the clock signal. It is desirable to position the sampling edges of the clock signal in the middle of the data eye to obtain good samples of the data signal. In this regard, FIGS. 1A-1D show examples of the clock signal (labeled "clk") at different phase positions with respect to the data signal (labeled "Data").

Figure 1A:
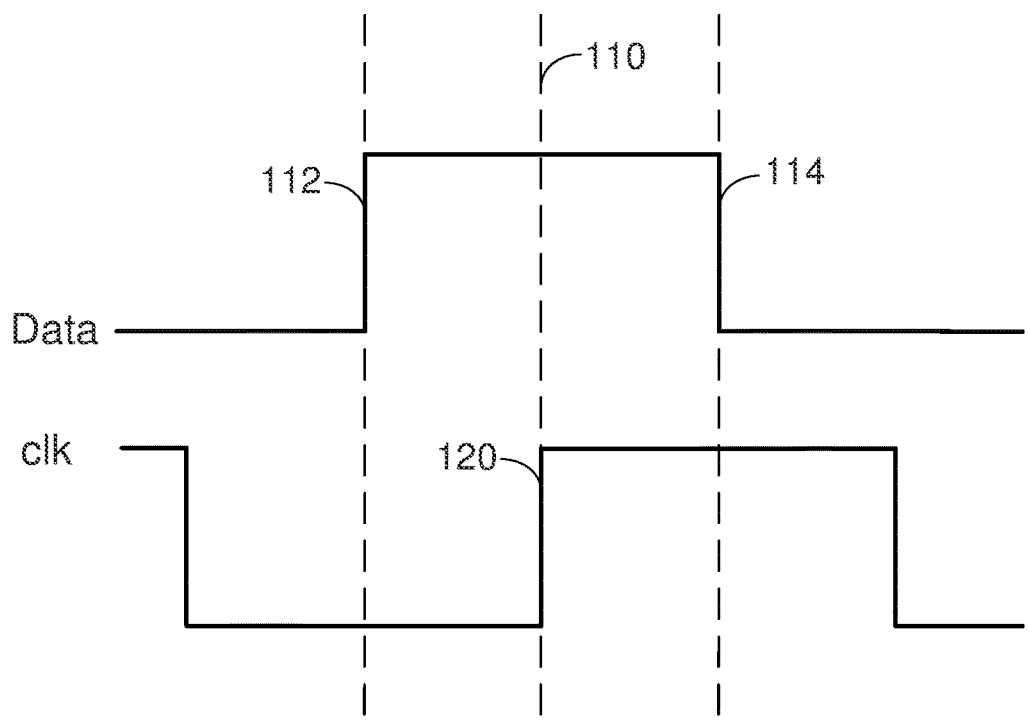
FIG. 1A shows an example in which a sampling edge of a clock signal is approximately aligned with a midpoint between two transitions in a data signal according to certain aspects of the present disclosure.

FIG. 1A shows an example in which the sampling edge 120 of the clock signal is approximately aligned with a midpoint 110 between transitions 112 and 114 (i.e., edges) in the data signal. Thus, in this example, the data signal is sampled at approximately the middle of the data eye, which provides good data sampling.

Figure 1B:
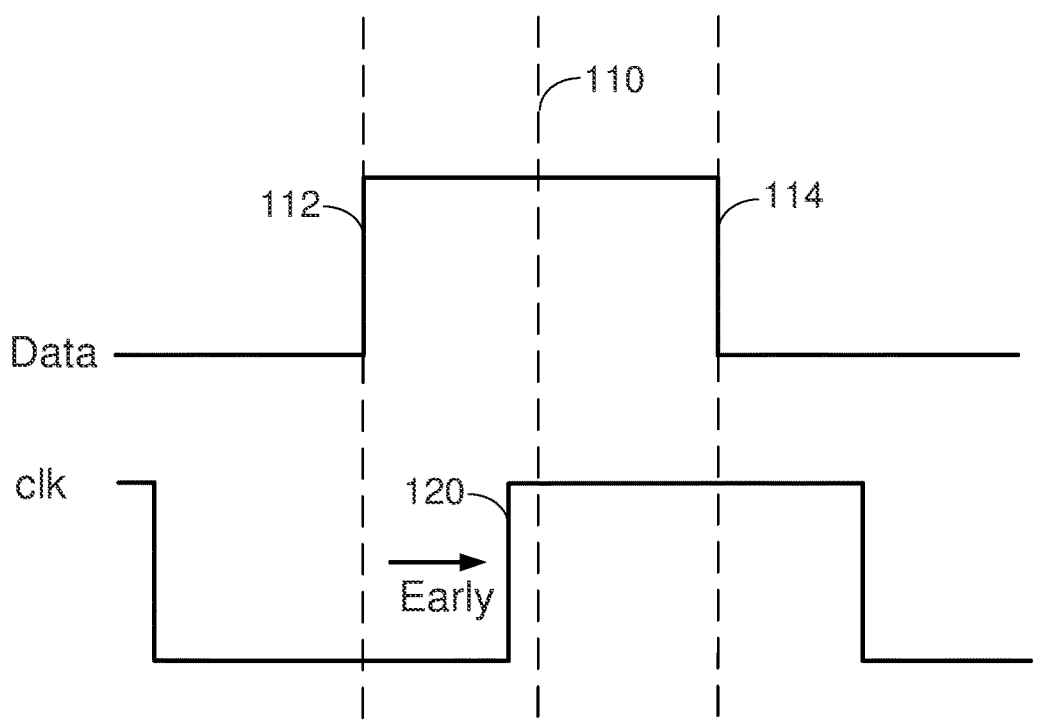
FIG. 1B shows an example of a clock signal that is early with respect to a data signal according to certain aspect of the present disclosure.

FIG. 1B shows an example in which the clock signal is early with respect to the data signal. As a result, the sampling edge 120 of the clock signal leads the midpoint 110 of the data signal. In this case, the CDR circuit may move the clock signal to the right in order to align the sampling edge 120 with the midpoint 110 of the data signal.

Figure 1C:
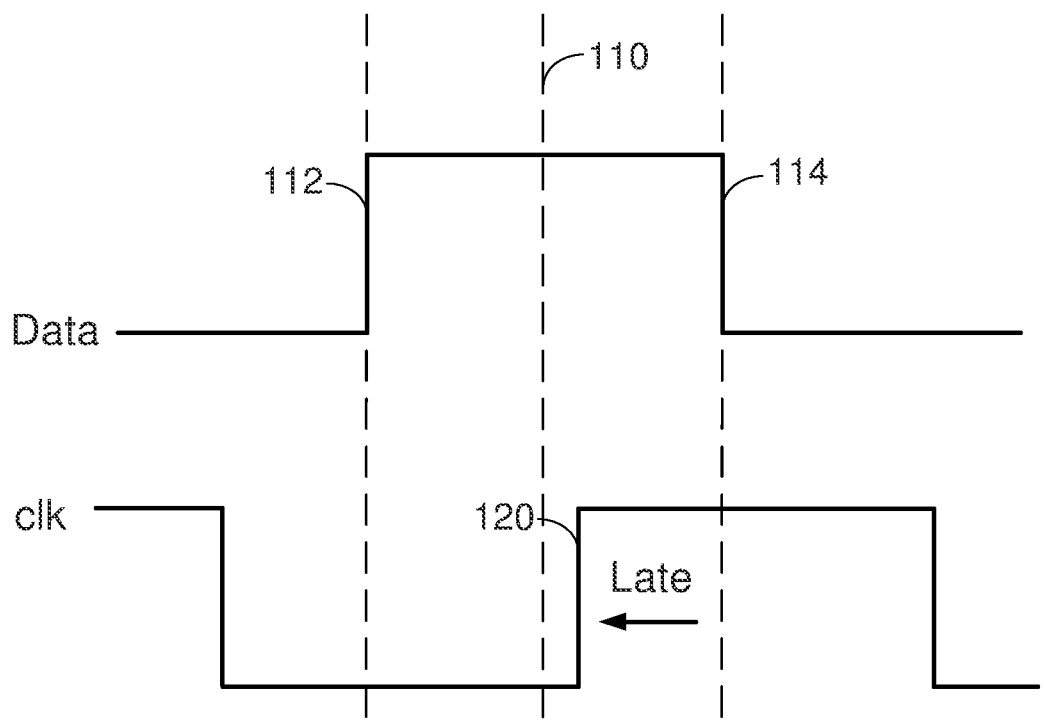
FIG. 1C shows an example of a clock signal that is late with respect to a data signal according to certain aspects of the present disclosure.

FIG. 1C shows an example in which the clock signal is late with respect to the data signal. As a result, the sampling edge 120 of the clock signal lags the midpoint 110 of the data signal. In this case, the CDR circuit may move the clock signal to the left in order to align the sampling edge 120 with the midpoint 110 of the data signal.

Figure 1D:
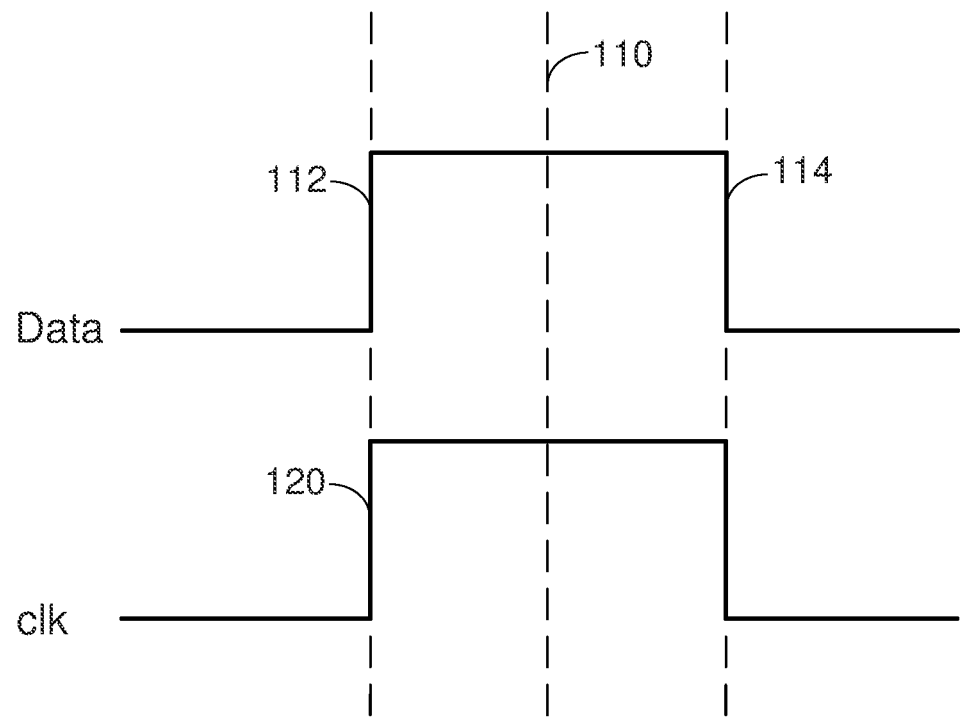
FIG. 1D shows an example of a clock signal that is approximately aligned with a data signal according to certain aspects of the present disclosure.

FIG. 1D shows an example in which the clock signal is approximately aligned with the clock signal. As a result, the sampling edge 120 of the clock signal is approximately aligned with a transition 112 of the data clock signal, which is a bad position for data sampling. In this case, the CDR circuit needs to move the clock signal to the right or left in order to move the clock signal out of the bad position for data sampling.

Figure 2:
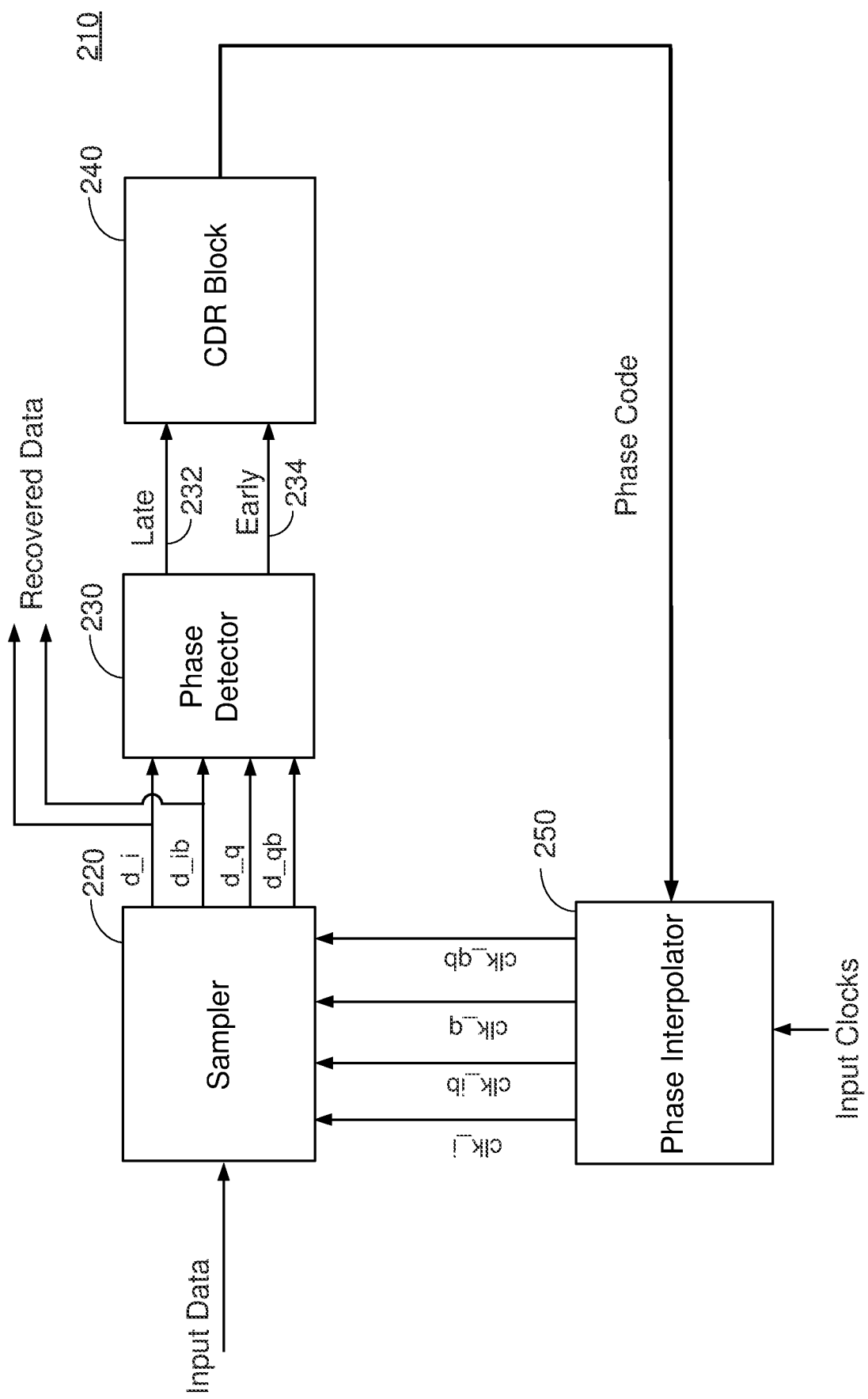
FIG. 2 shows an example of a clock data recovery (CDR) circuit according to certain aspects of the present disclosure.

FIG. 2 shows an example of a CDR circuit 210 according to certain aspects of the present disclosure. The CDR circuit 210 includes a sampler 220, a phase detector 230, a CDR block 240, and a phase interpolator 250. The sampler 220 is configured to receive a data signal at the receiver (e.g., from a high-speed serial data link or another type of data link).

The data signal may undergo preprocessing (e.g., equalization, amplification, filtering, etc.) at the receiver before being input to the sampler 220. The sampler 220 also receives a four-phase clock signal from the phase interpolator 250.

The four-phase clock signal includes four clock signals clk_i, clk_ib, clk_q and clk_qb that are spaced 90 degrees apart in phase. More particularly, clock signal clk_q is spaced 90 degrees from clock signal clk_i, clock signal clk_ib is spaced 180 degrees from clock signal clk_i, and clock signal clk_qb is spaced 180 degrees from clock signal clk_q. Each of the clock signals clk_i, clk_ib, clk_q and clk_qb may have a frequency that is approximately equal to half the data rate of the data signal.

The sampler 220 samples the data signal using the clock signals clk_i, clk_ib, clk_q and clk_qb to obtain data samples d_i, d_ib, d_q and d_qb, respectively. The sampler 220 may sample the data signal on rising edges of the clock signals clk_i, clk_ib, clk_q and clk_qb or falling edges of the clock signals clk_i, clk_ib, clk_q and clk_qb. The data samples d_i and d_ib provide data bits recovered from the data signal, and may be output to another component (not shown) in the receiver for further processing. The data samples d_q and d_qb are used in conjunction with the data samples d_i and d_ib to provide the phase detector 230 with information for determining whether the clock signal clk_i is early or late with respect to the data signal, as discussed further below.

The data samples d_i, d_ib, d_q and d_qb are input to the phase detector 230. The phase detector 230 determines whether the clock signal clk_i is early or late with respect to the data signal based on the data samples d_i, d_ib, d_q and d_qb, and outputs a signal indicating whether the clock signal clk_i is early or late. In this regard, the phase detector 230 includes a late output 232 and an early output 234. If the phase detector 230 determines that the clock signal clk_i is late, then the phase detector 230 may output a one on the late output 232 and a zero on the early output 234. If the phase detector 230 determines that the clock signal clk_i is early, then the phase detector 230 may output a zero on the late output 232 and a one on the early output 234.

The phase detector 230 may require a data transition in the data signal in order to determine whether the clock signal clk_i is early or late. Thus, during a time period when there is no data transition in the data signal (e.g., consecutive data bits in the data signal have the same value), the data samples d_i, d_ib, d_q and d_qb may not provide the phase detector 230 with enough information to determine whether the clock signal clk_i is early or late. In this case, the phase detector 230 may output a zero on the late output 232 and a zero on the early output 234, indicating a hold condition.

The outputs 232 and 234 of the phase detector 230 are input to the CDR block 240. The CDR block 240 processes the outputs of the phase detector 230 to generate a phase code for the phase interpolator 250. The phase code specifies the phase positions of the clock signals clk_i, clk_ib, clk_q and clk_qb, as discussed further below. The phase code may also be referred to as a CDR code, a phase interpolator code or another term. The CDR block 240 may include a proportional path with proportional gain, an integration path with integration gain, an integrator and/or other components known to those skilled in the art. The gains in the CDR block 240 may be adjusted to provide desired CDR loop characteristics (e.g., stability) for the CDR circuit 210, as is known to those skilled in the art. The CDR block 240 may update the phase code once per phase update interval, in which one update interval may correspond to one or more periods (cycles) of the clock signals.

The phase interpolator 250 receives the phase code from the CDR block 240 and sets the phase positions of the clock signals clk_i, clk_ib, clk_q and clk_qb based on the phase code. For example, the phase code may have 64 possible values, in which changing the phase code by one (i.e., one phase step) corresponds to a phase shift of approximately (360/64) degrees. Thus, if the phase code is changed by k phase steps in this example, then the phase interpolator 250 shifts the phases of the clock signals clk_i, clk_ib, clk_q and clk_qb by approximately k*(360/64) degrees. Note that the phases of the clock signals clk_i, clk_ib, clk_q and clk_qb are shifted by the same amount to maintain the 90-degree spacing between the phases of the clock signals clk_i, clk_ib, clk_q and clk_qb. The phase interpolator 250 uses phase interpolation to generate the clock signals clk_i, clk_ib, clk_q and clk_qb from input clocks, as is known in the art.

In operation, the CDR block 240 adjusts the phase code based on early/late information from the phase detector 230 to approximately align the clock signals clk_i and clk_ib in the middle of the data eye (illustrated in FIG. 1A). If the phase detector 230 indicates that the clock signal clk_i is early with respect to the data signal, then the CDR block 240 may adjust the phase code to cause the phase interpolator 250 to phase shift the clock signals clk_i, clk_ib, clk_q and clk_qb to the right (illustrated in FIG. 1B). If the phase detector 230 indicates that the clock signal clk_i is late with respect to the data signal, then the CDR block 240 may adjust the phase code to cause the phase interpolator 250 to phase shift the clock signal clk_i, clk_ib, clk_q and clk_qb to the left (illustrated in FIG. 1C).

Figure 3:
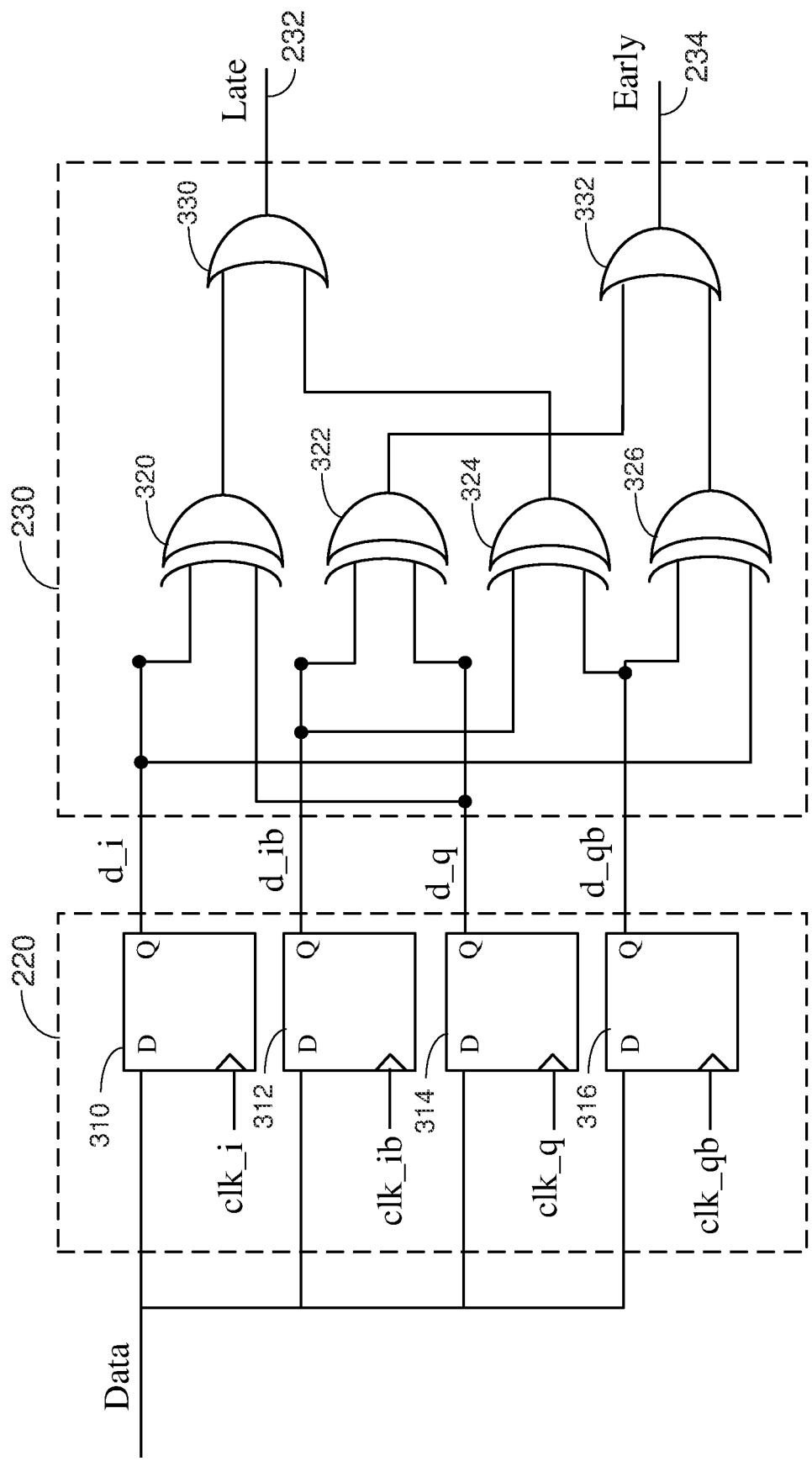
FIG. 3 shows an example of a bang-bang phase detector according to certain aspects of the present disclosure.

FIG. 3 shows an exemplary implementation of the sampler 220 and the phase detector 230 according to certain aspects. In this example, the sampler 220 includes four latches 310, 312, 314 and 316. Each of the latches 310, 312, 314 and 316 receives the data signal and a respective one of the clock signals clk_i, clk_ib, clk_q and clk_qb, as shown in FIG. 3. Latch 310 is configured to latch the value of the data signal on a rising or falling edge of the clock signal clk_i, and output the latched value as data sample d_i. Latch 312 is configured to latch the value of the data signal on a rising or falling edge of the clock signal clk_ib, and output the latched value as data sample d_ib. Latch 314 is configured to latch the value of the data signal on a rising or falling edge of the clock signal clk_q, and output the latched value as data sample d_q. Finally, latch 316 is configured to latch the value of the data signal on a rising or falling edge of the clock signal clk_qb, and output the latched value as data sample d_qb.

The phase detector 230 includes logic that receives the data samples d_i, d_ib, d_q and d_qb, and generates late and early signals based on the logic values of the received data samples d_i, d_ib, d_q and d_qb. In this example, the phase detector 230 is a bang-bang phase detector that indicates whether the clock signal clk_i is early or late with respect to the data signal.

In the example in FIG. 3, the phase detector 230 includes exclusive-OR (XOR) gates 320, 322, 324 and 326, and OR gates 330 and 332. The inputs of XOR gate 320 receive data samples d_i and d_q, the inputs of XOR gate 322 receive data samples d_ib and d_q, the inputs of XOR gate 324 receive data samples d_ib and d_qb, and the input of XOR gate 326 receives data samples d_qb and d_i. The inputs of OR gate 330 receive the outputs of XOR gates 320 and 324, and the inputs of OR gate 332 receive the outputs of XOR gates 322 and 326. The output of OR gate 330 outputs the late signal on the late output 232, and the output of OR gate 332 outputs the early signal on the early output 234. It is to be appreciated the phase detector 230 is not limited to the exemplary implementation shown in FIG. 3, and that the phase detector 230 may be implemented with a different combination of logic gates. Also, it is to be appreciated that some phase detector designs may use only three of the data samples (e.g., d_i, d_q and d_ib) to generate the early and late signals.

When a link (e.g., serial link) is established between a transmitter transmitting the data signal and the receiver incorporating the CDR circuit 210, the CDR circuit 210 may lock shortly after the link is established. Ideally, the CDR circuit 210 locks such that the sampling edge of the clock signal clk_i is approximately aligned in the middle of the data eye (illustrated in FIG. 1A) for good data sampling.

However, the CDR circuit 210 may lock to a bad position in which the clock signal clk_i is approximately aligned with the data signal (illustrated in FIG. 1D). This may be caused by distortion in the data signal and/or distortion in one or more of the clock signals clk_i, clk_ib, clk_q and clk_qb. The distortion may include systematic distortion (e.g., duty cycle distortion) introduced by one or more devices in the transmitter and/or one or more devices in the receiver. There may be a dead-zone in which the CDR circuit 210 becomes locked (stuck) in the bad position. Examples in which the CDR circuit 210 is stuck in the bad position due to distortion will now be discussed with reference to FIGS. 4-7.

Figure 4:
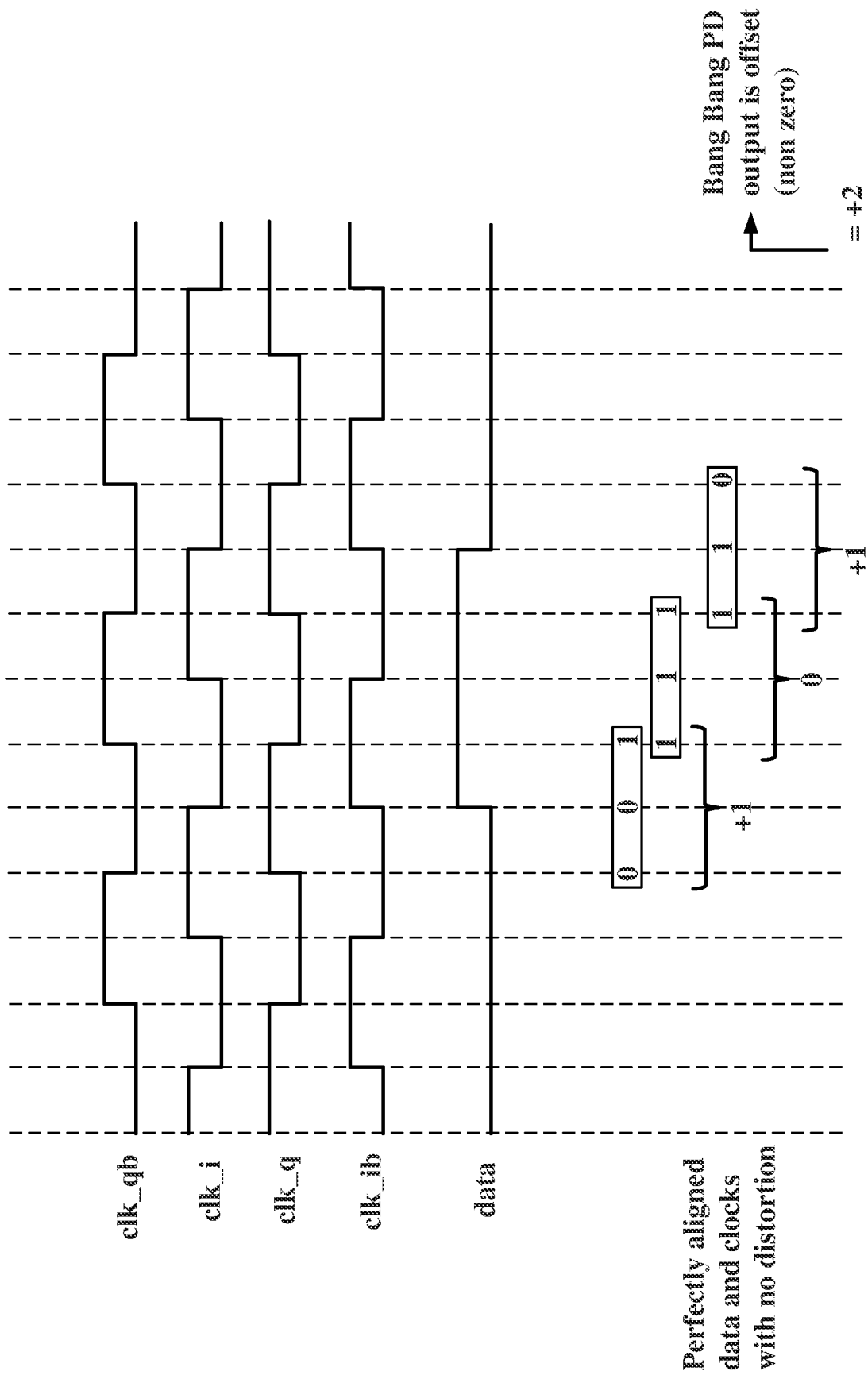
FIG. 4 shows an example of phase detector outputs for a case of no distortion according to certain aspects of the present disclosure.

FIG. 4 is a timing diagram illustrating an ideal case with no distortion, in which the incoming data signal includes two consecutive data bits having a value of one. In the example in FIG. 4, the clock signal clk_i is aligned with the data signal, and therefore in a bad position for data sampling. In this example, the phase detector 230 outputs two early signals (represented by +1) for the data pattern in FIG. 4. The two early signals result in a PD output offset of +2, which helps the CDR loop push the clock signal clk_i out of the bad position. Note that 0 in FIG. 4 represents the hold condition.

Figure 5:
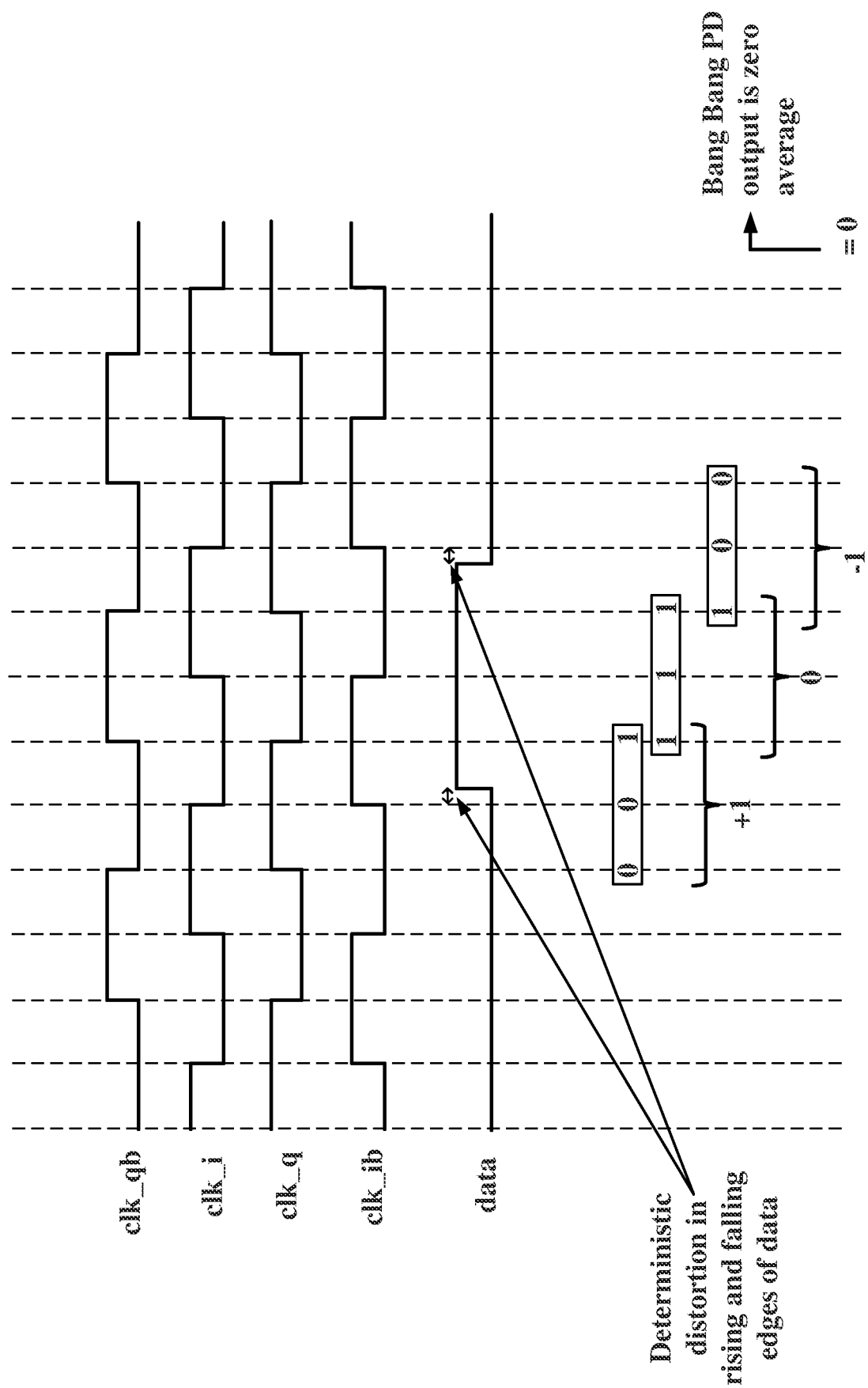
FIG. 5 shows an example of phase detector outputs for a case of distortion in a data signal according to aspects of the present disclosure.

FIG. 5 shows a non-ideal case in which there is distortion in the rising and falling edges of the data signal. Similar to FIG. 4, FIG. 5 shows an example in which the incoming data signal includes two consecutive data bits having a value of one, and the clock signal clk_i is aligned with the data signal (i.e., the clock signal clk_i is in the bad position). However, in this case, the phase detector 230 outputs an early signal (+1) and a late signal (−1) for the data pattern in FIG. 5 due to the distortion in the data signal. The early signal and the late signal result in a PD output offset of zero instead of +2 in the ideal case shown in FIG. 4. As a result, the clock signal clk_i is stuck in the bad position (i.e., stuck in the dead-zone).

Figure 6:
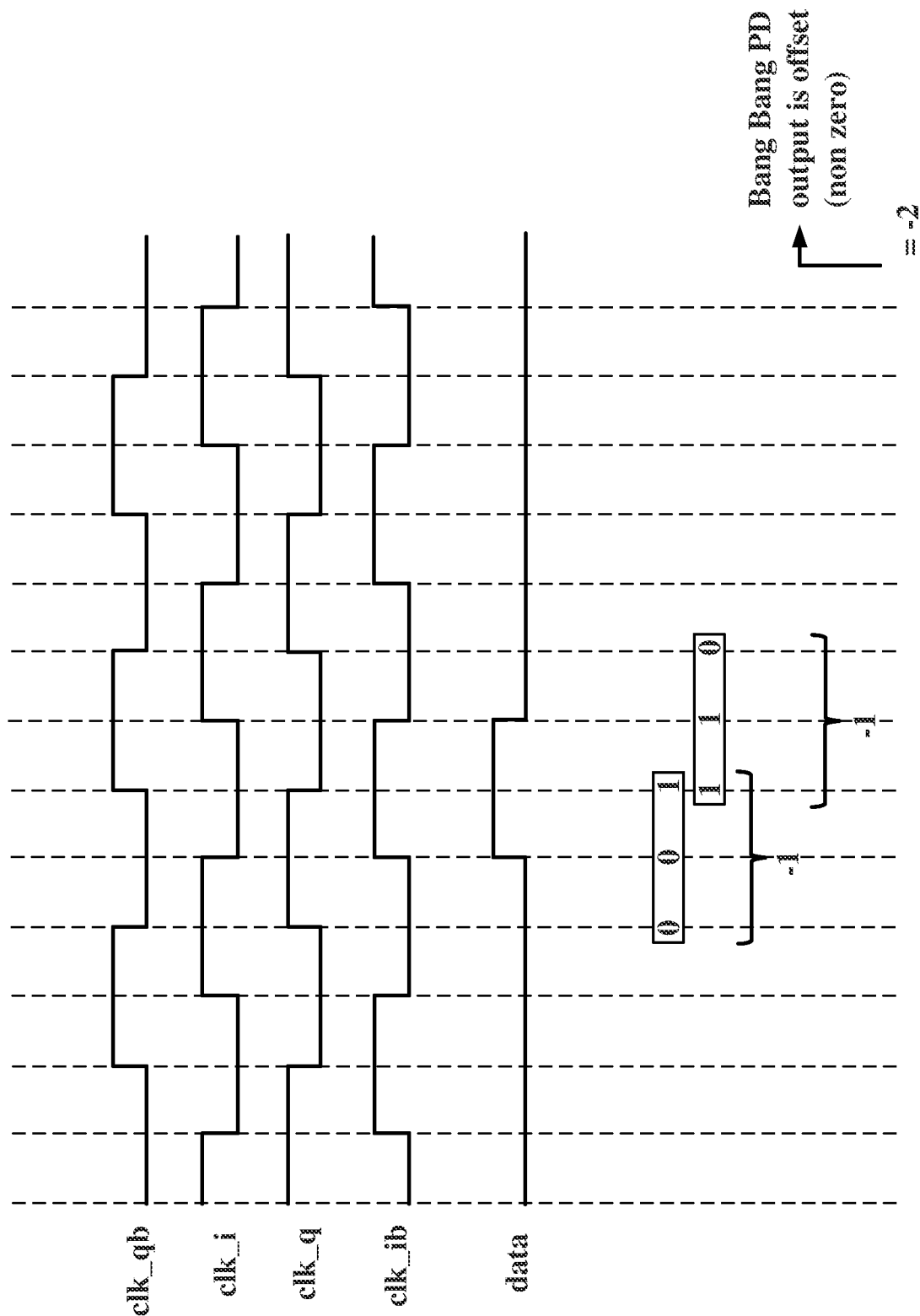
FIG. 6 shows another example of phase detector outputs for a case of no distortion according to certain aspects of the present disclosure.

FIG. 6 is a timing diagram illustrating an ideal case with no distortion, in which the incoming data signal includes a data bit of one. In the example in FIG. 6, the clock signal clk_i is aligned with the data signal, and therefore in a bad position for data sampling. In this example, the phase detector 230 outputs two late signals (represented by −1) for the data bit. The two late signals result in a PD output offset of −2, which helps the CDR loop push the clock signal clk_i out of the bad position. Note that the clock signal clk_i can be pushed out of the bad position in either direction.

Figure 7:
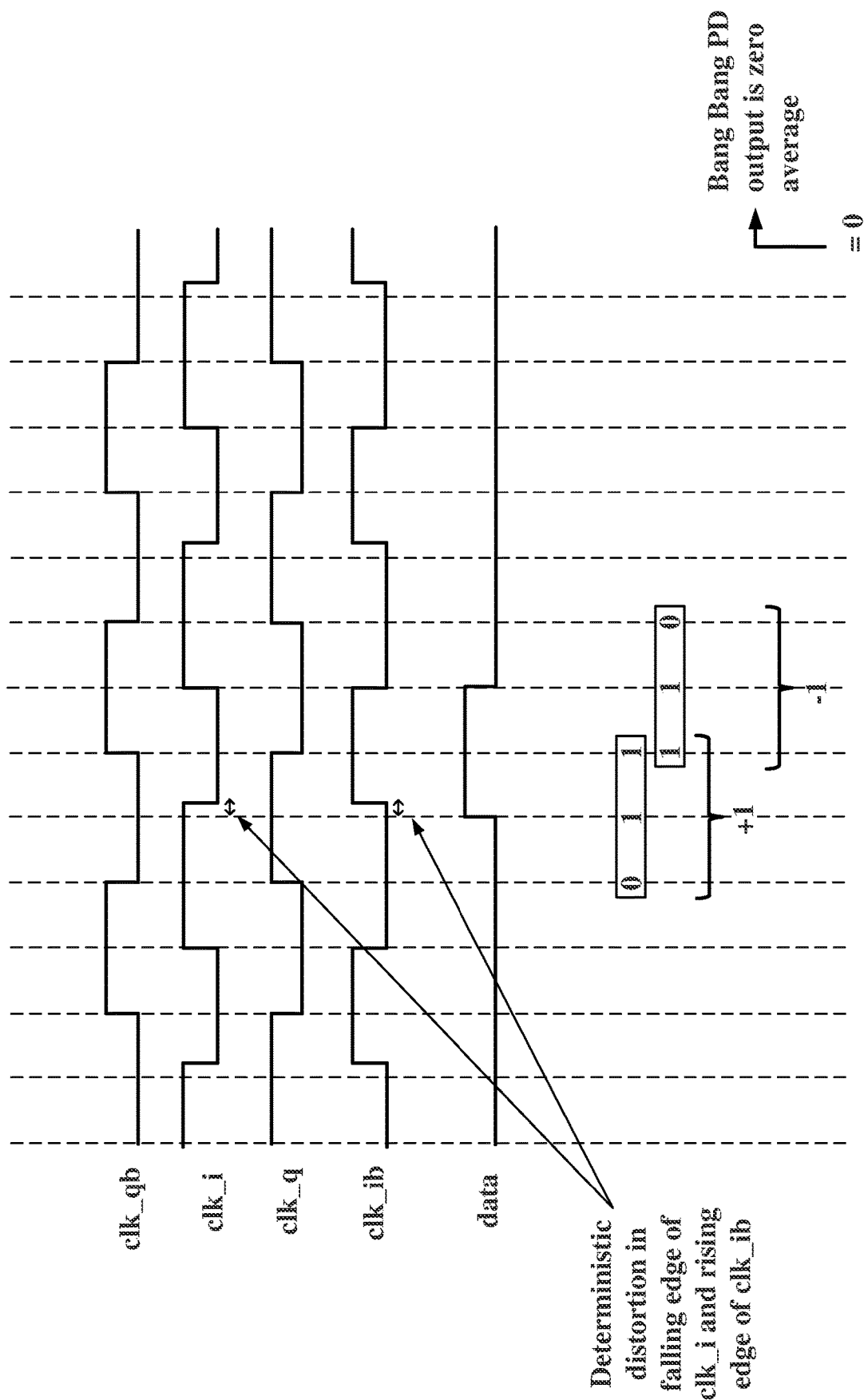
FIG. 7 shows an example of phase detector outputs for a case of distortion in two clock signals according to certain aspects of the present disclosure.

FIG. 7 shows a non-ideal case in which there is distortion in the falling edge of the clock signal clk_i and the rising edge of the clock signal clk_ib. Similar to FIG. 6, FIG. 7 shows an example in which the incoming data signal includes a data bit of one, and the clock signal clk_i is aligned with the data signal (i.e., the clock signal clk_i is in the bad position). However, in this case, the phase detector 230 outputs an early signal (+1) and a late signal (−1) for the data bit due to the distortion in the clock signals clk_i and clk_ib. The early signal and the late signal result in a PD output offset of zero instead of −2 in the ideal case shown in FIG. 6. As a result, the clock signal clk_i is stuck in the bad position (i.e., stuck in the dead-zone).

Thus, FIGS. 4-7 show that distortion in the data signal or the clock signals can cause the CDR circuit 210 to become stuck in the dead-zone (i.e., the clock signal clk_i to become stuck in the bad position where the clock signal clk_i is approximately aligned with the data signal). Note that other phases of the clock (clk_q, clk_ib, and clk_qb) follow clk_i and they will be in stuck position as well. In practice, distortion in the data signal and distortion in the clock signals happen simultaneously.

To address this, aspects of the present disclosure provide systems and methods for pushing a CDR circuit out of the dead-zone. In some implementations, this is accomplished by changing the phase code by an amount that is large enough to push the CDR circuit out of the dead-zone, as discussed further below.

Figure 8:
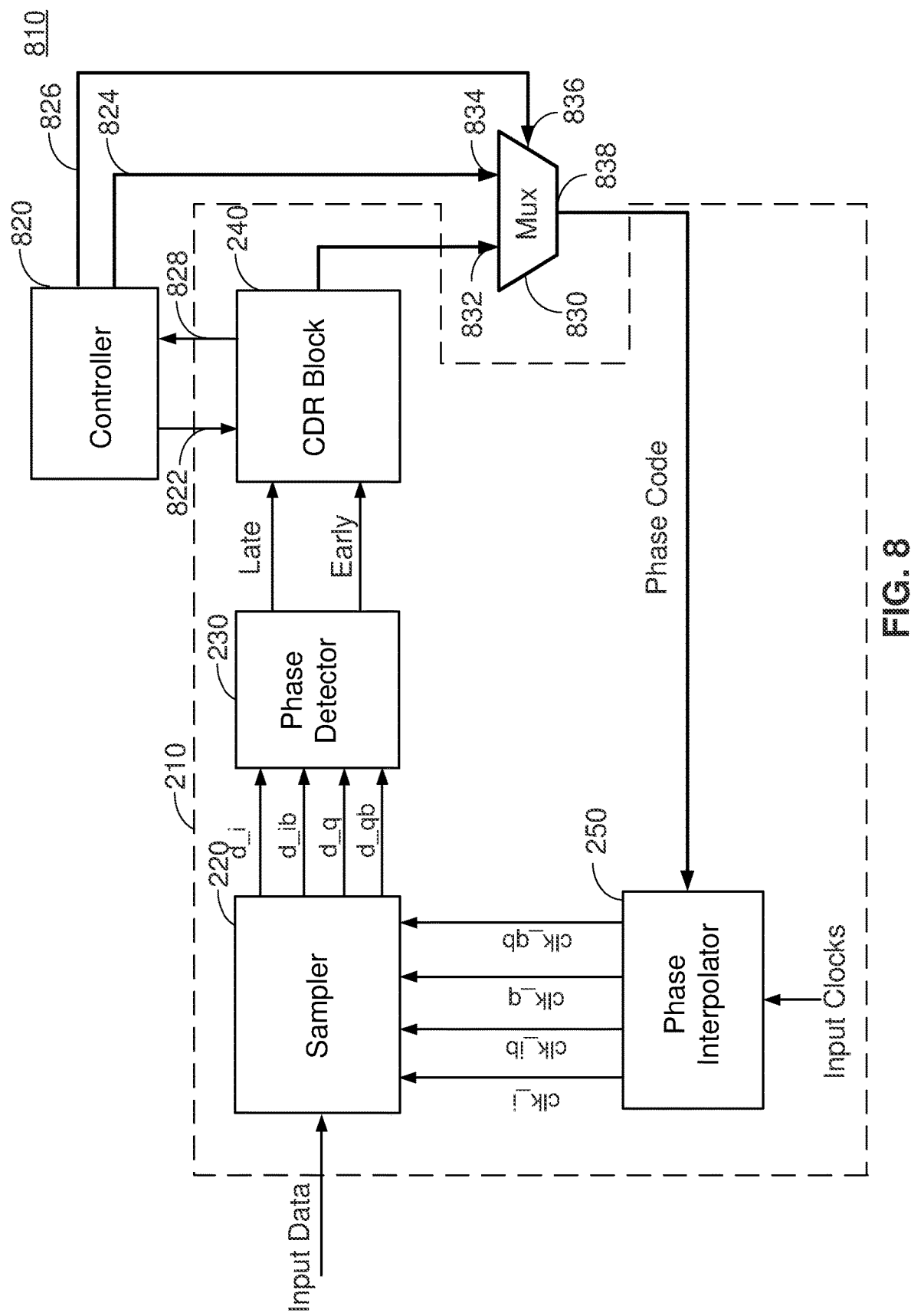
FIG. 8 shows an example of a controller for fixing dead-zone in a CDR circuit according to certain aspects of the present disclosure.

FIG. 8 shows an example of a system 810 according to aspects of the present disclosure. The system 810 includes the CDR circuit 210 shown in FIG. 2, including the sampler 220, the phase detector 230, the CDR block 240 and the phase interpolator 250 discussed above.

The system 810 also includes a controller 820 and a multiplexer 830. The controller 820 is configured to selectively freeze and unfreeze the CDR block 240 via control line 822, as discussed further below. The controller 820 is also configured to read the phase code from the CDR block 240 via read line 828. The controller 820 may also read the phase code from the same CDR block output that outputs the phase code to the phase interpolator 250. The controller 820 is also configured to output a phase code to the multiplexer via line 824, and output a select signal to the multiplexer via line 826, as discussed further below. Exemplary operations of the controller 820 are discussed further below according to aspects of the present disclosure.

The multiplexer 830 has a first input 832 coupled to the output of the CDR block 240, a second input 834 coupled to the controller 820 via line 824, a select input 836 coupled to the controller 820 via line 826, and an output 838 coupled to the input of the phase interpolator 250. The multiplexer 830 is configured to receive the select signal at the select input 836 from the controller 820, and selectively couple the output of the CDR block 240 or the controller 820 to the phase interpolator 250 based on the select signal. For example, the multiplexer 830 may couple the output of the CDR block 240 to the phase interpolator 250 when the select signal has a first logic value, and couple the controller 820 to the phase interpolator 250 when the select signal has a second logic value.

When the multiplexer 830 couples the output of the CDR block 240 to the phase interpolator 250, the sampler 220, the phase detector 230, the CDR block 240 and the phase interpolator 250 operate in the same manner as in the CDR circuit 210 shown in FIG. 2. When the multiplexer 830 couples the controller 820 to the phase interpolator 250, the controller 820 is able to change the phase code input to the phase interpolator 250, as discussed further below. Thus, the multiplexer 830 allows the controller 820 to control the phase code input to the phase interpolator 250.

Figure 9:
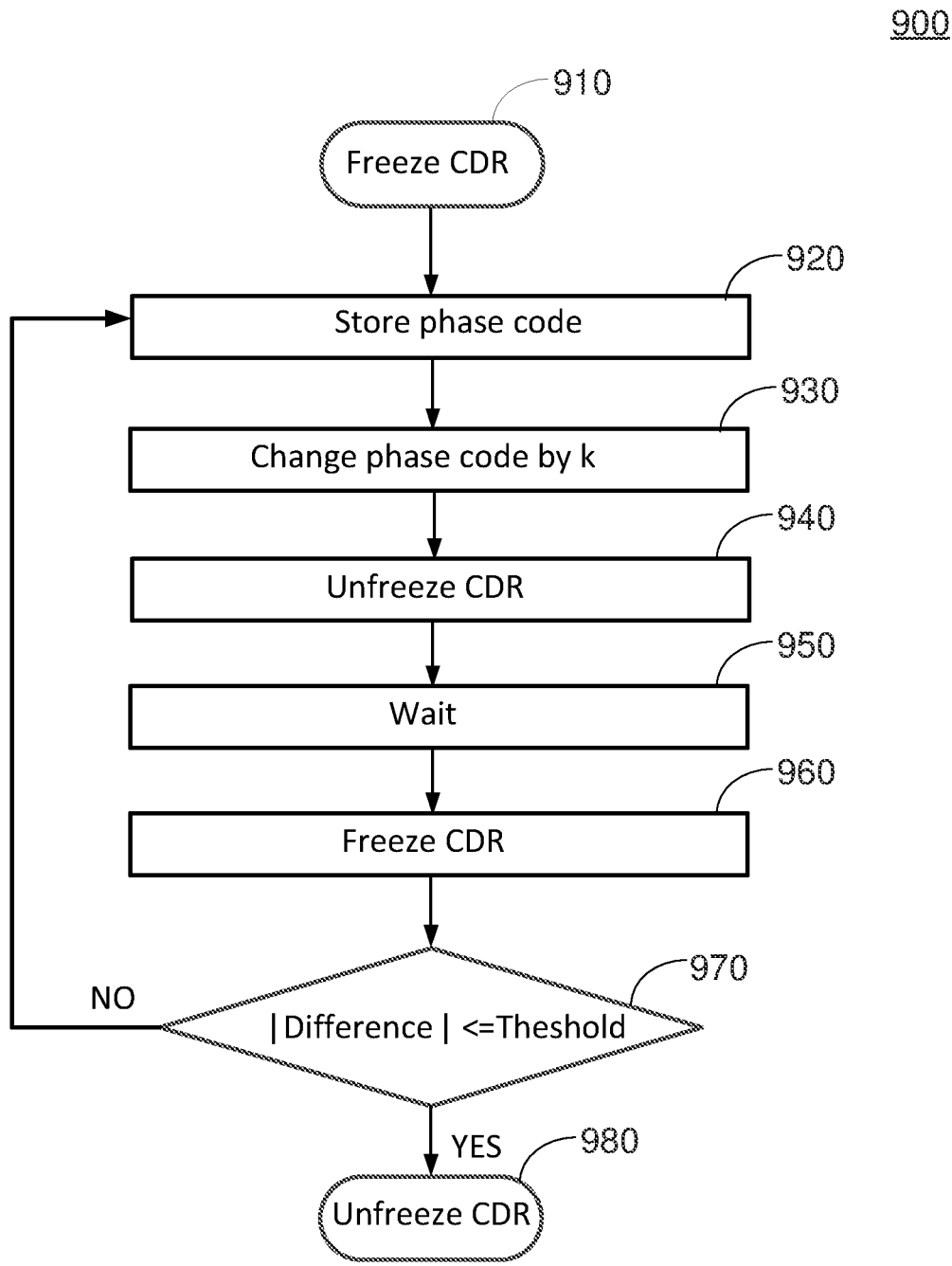
FIG. 9 illustrates an exemplary process according to certain aspects of the present disclosure.

Exemplary operations of the controller 820 will now be discussed with reference to FIG. 9, which illustrates an exemplary process 900 that may be performed by the controller 820 according to aspects of the present disclosure.

In block 910, the controller 820 freezes the CDR block 240. For example, at the start of link establishment between the transmitter and the receiver, the controller 820 may allow the CDR loop to run for a period of time (e.g., 1 µs) before freezing the CDR block 240 to give the CDR circuit 210 time for an initial lock. Thus, the controller 820 may wait for the CDR circuit 210 to lock before freezing the CDR block 240. At the time the controller 820 freezes the CDR block 240, the clock signal clk_i may be approximately aligned with the middle of the data eye (i.e., the CDR circuit 210 is initially locked in a good position) or the clock signal clk_i may be approximately aligned with the data signal (i.e., the CDR circuit 210 is initially locked in a bad position). If the CDR circuit 210 is locked in the bad position due to distortion in the data signal and/or clock signals, then the CDR loop gain may be very low.

In block 920, the controller 820 reads the current phase code from the CDR block 240 and stores the read phase code in a memory (not shown in FIG. 8). The stored phase code corresponds to the initial lock position of the CDR circuit 210.

In block 930, the controller 820 changes the phase code by k steps to obtain an updated phase code. For example, the controller 820 may do this by adding k to or subtracting k from the phase code. In one example, the k steps may correspond to a phase shift of approximately 45 degrees. For instance, if each step corresponds to a phase shift of (360/64) degrees, then setting k equal to 8 corresponds to a phase shift of 45 degrees. The controller 820 may input the updated phase code to the phase interpolator 250 by instructing the multiplexer 830 to couple the controller 820 to the phase interpolator 250 using the select signal.

In block 940, the controller 820 unfreezes the CDR block 240 after changing the phase code. When the CDR block 240 is unfrozen, the controller 820 instructs the multiplexer 830 to couple the output of the CDR block 240 to the phase interpolator 250, allowing the CDR loop to run.

In block 950, the controller 820 waits (e.g., 1 µs) for the CDR circuit 210 to lock.

In block 960, the controller 820 freezes the CDR block 240, and reads a new phase code from the CDR block 240 corresponding to the current lock position. The controller 820 may then compute the difference between the new phase code and the phase code stored in block 920, in which the phase code stored in block 920 corresponds to the initial lock position.

In block 970, the controller 820 compares the magnitude of the difference with a threshold. The threshold may be relatively small (e.g., a code value of one to three) so that a difference equal to or less than the threshold indicates that the current lock position is the same or in close proximity to the initial lock position in block 920. A difference equal to or less than the threshold indicates that the CDR loop went back (returned) to the initial lock position after the phase code change in block 930. This indicates that the initial lock position corresponds to a good lock position for data sampling (i.e., a true lock). Thus, if the CDR circuit 210 is initially locked in a good position, the CDR circuit 210 returns to the good position after the phase code is changed in block 930. In this case, the controller 820 may unfreeze the CDR block 240 in block 980, and allow the CDR loop to continue to run.

A difference greater than the threshold may indicate that the initial lock position was stuck in the dead-zone (i.e., bad position). In this case, the phase code change in block 930 may have pushed the CDR circuit 210 out of the dead-zone, allowing the CDR circuit 210 to lock to the current lock position. If the difference is greater than the threshold, then the controller 820 returns to block 920 to confirm that the current lock position is a good lock position. In this case, the controller 820 repeats blocks 920 through 970 in a second iteration, in which the current lock position in block 970 in the first iteration becomes the initial lock position in block 920 in the second iteration. In the second iteration of block 930, the controller 820 may change the phase code by k or a different amount. If the magnitude of the difference is equal to or less than the threshold in block 970 in the second iteration, then the controller 820 may confirm that the CDR circuit 210 is indeed locked in a good position. In this case, the controller 820 may unfreeze the CDR block 240 in block 980, and allow the CDR loop to run.

If the difference is still greater than the threshold, then the controller 820 may repeat blocks 920 through 970 in a third iteration and so forth until the difference in block 970 becomes equal to or less than the threshold.

In the above example, the controller 820 instructs the multiplexer 830 to couple the output of the CDR block 240 to the phase interpolator 250 when the CDR block 240 is unfrozen, allowing the CDR loop to run. The controller 820 instructs the multiplexer 830 to couple the controller 820 to the phase interpolator 250 when the controller 820 changes the phase code (e.g., in block 930) so that the controller 820 can input the resulting updated phase code to the phase interpolator 250.

As discussed above, the controller 820 changes the phase code by k in block 930. The value of k may be chosen such that the corresponding phase shift (e.g., 45 degrees) is high enough to push the CDR circuit 210 out of a dead-zone if the CDR circuit 210 is stuck in the dead-zone while at the same time not pushing the CDR circuit 210 into the dead-zone if the CDR circuit 210 is locked in a good position. For example, to satisfy this condition, the value of k may be higher than the width of the dead-zone and less than half of a normal data eye opening width. In one example, the value of k may correspond to a phase shift between 20 degrees and 90 degrees.

Figure 10:
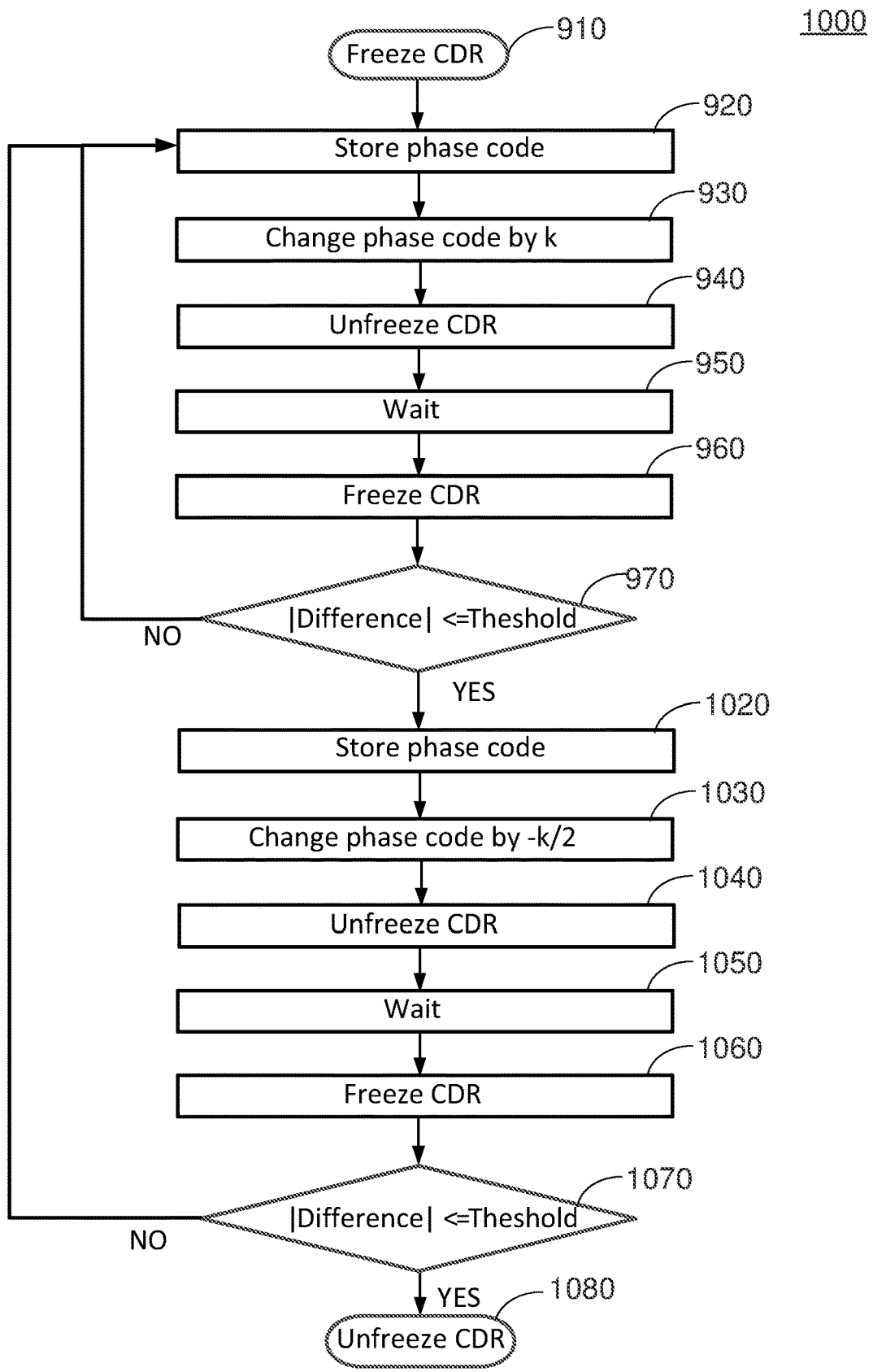
FIG. 10 illustrates another exemplary process according to certain aspects of the present disclosure.

Instead of unfreezing the CDR circuit 210 in block 980 when the difference is equal to or less than the threshold, the controller 820 may confirm that the CDR circuit 210 returns to the lock position when the phase code is moved in the opposite direction. In this regard, FIG. 10 shows an exemplary process 1000 that includes the process 900 in FIG. 9 and an additional confirmation process after block 970 to confirm that the CDR circuit 210 returns to the lock position when the phase code is moved in the opposite direction.

After the difference is equal to or less than the threshold in block 970, the controller 820 advances to block 1020. In block 1020, the controller 820 reads the current phase code from the CDR block 240 and stores the read phase code in a memory (not shown in FIG. 8). It is to be appreciated that the controller 820 may have already read and stored the current phase code to compute the difference for preceding block 970, in which case block 1020 may be skipped.

In block 1030, the controller 820 changes the phase code by −k/2 steps to obtain an updated phase code. Thus, in this example, the controller 820 moves the phase code by half the amount in the opposite direction (i.e., −k/2 is in the opposite direction of k and the magnitude of −k/2 is approximately half the magnitude of k). However, it is to be appreciated the present disclosure is not limited to this example, and that the controller 820 may change the phase code by a different amount in the opposite direction. The controller 820 may input the updated phase code to the phase interpolator 250 by instructing the multiplexer 830 to couple the controller 820 to the phase interpolator 250 using the select signal.

In block 1040, the controller 820 unfreezes the CDR block 240 after changing the phase code. When the CDR block 240 is unfrozen, the controller 820 instructs the multiplexer 830 to couple the output of the CDR block 240 to the phase interpolator 250, allowing the CDR loop to run.

In block 1050, the controller 820 waits (e.g., 1 µs) for the CDR circuit 210 to lock.

In block 1060, the controller 820 freezes the CDR block 240, and reads a new phase code from the CDR block 240 corresponding to the current lock position. The controller 820 may then compute the difference between the new phase code and the phase code stored in block 1020.

In block 1070, the controller 820 compares the magnitude of the difference with the threshold. A difference less equal to or less than the threshold indicates that the CDR loop went back to the lock position in block 1020 after the phase code change in block 1030, which confirms that the CDR circuit 210 is locked in a good position. In this case, the controller 820 may unfreeze the CDR block 240 in block 1080, and allow the CDR loop to run.

If the difference is greater than the threshold, then the controller 820 returns to block 920 to start the process 1000 from the beginning. The controller 820 may repeat the process 1000 until the difference in block 1070 becomes equal to or less than the threshold.

Figure 11:
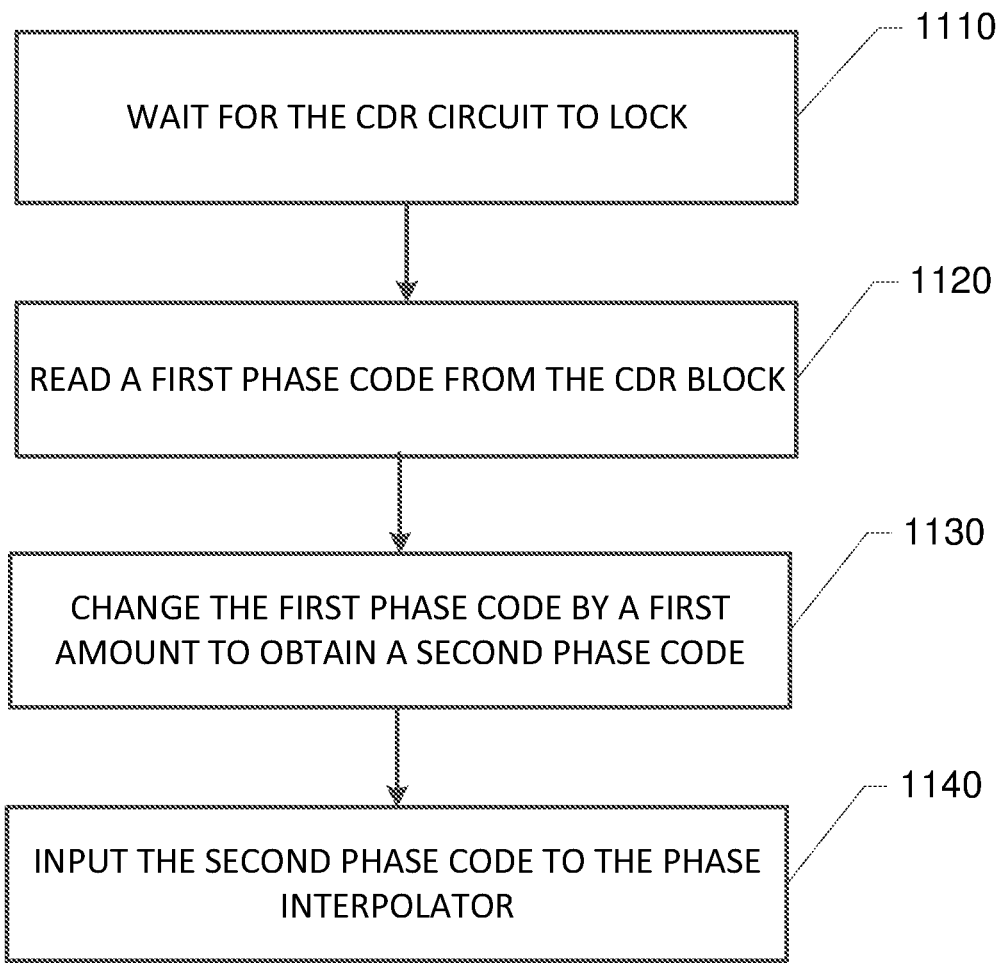
FIG. 11 is a flowchart showing a method for fixing a dead-zone in a CDR circuit according to certain aspects of the present disclosure.

FIG. 11 is a flowchart illustrating a method 1100 for fixing a dead-zone in a clock and data recovery (CDR) circuit according to certain aspects. The CDR circuit (e.g., CDR circuit 210) includes a CDR block (e.g., CDR block 240) and a phase interpolator (e.g., phase interpolator 250), wherein the CDR block is configured to generate phase codes based on signals (e.g., early/late signals) from a phase detector (e.g., phase detector 230), and the phase interpolator is configured to adjust a phase of a clock signal (e.g., clock signal clk_i) based on the phase codes. Note that the CDR block 240 updates the phase code once per phase update interval, and therefore may be considered to generate a phase code every phase update interval. In this case, the phase codes generated by the CDR block 240 are spaced apart in time by the phase update interval. Two or more consecutive phase codes may be the same (e.g., in the hold condition). The method 1100 may be performed by the controller 820.

In block 1110, the controller waits for the CDR circuit to lock. For example, after link establishment, the controller may wait (e.g., 1 µs) for the CDR circuit to lock. During this time, the CDR circuit allows the CDR loop run in order to lock the CDR circuit.

In block 1120, a first phase code is read from the CDR block. The first phase code may correspond to an initial lock position for the CDR circuit.

In block 1130, the first phase code is changed by a first amount to obtain a second phase code. For example, the first phase code may be changed by k phase steps. In this example, the controller may add k to or subject k from the first phase code to obtain the second phase code. The amount may correspond to a phase shift that is high enough to push the CDR circuit out of the dead-zone if the CDR circuit is stuck in the dead-zone. The controller 820 may freeze the CDR block before reading the first phase code.

In block 1140, the second phase code is input to the phase interpolator. If the CDR circuit is initially stuck in the dead-zone, the change in the phase code pushes the CDR circuit out of the dead-zone and the CDR circuit locks to a position that is different from the initial position. If the CDR circuit is initially locked in a good position, then the CDR circuit may return to the initial lock position. After inputting the second phase code to the phase interpolator 250, the controller may unfreeze the CDR block to allow the CDR loop to run.

The controller 820 discussed above may be implemented with a general-purpose processor, a digital signal processor (DSP), an application specific integrated circuit (ASIC), a field programmable gate array (FPGA) or other programmable logic device, discrete hardware components (e.g., logic gates), a state machine or any combination thereof designed to perform the functions described herein. A processor may perform the functions described herein by executing software comprising code for performing the functions. The software may be stored on a computer-readable storage medium, such as a RAM, a ROM, an EEPROM, an optical disk, and/or a magnetic disk.

Figure 12:
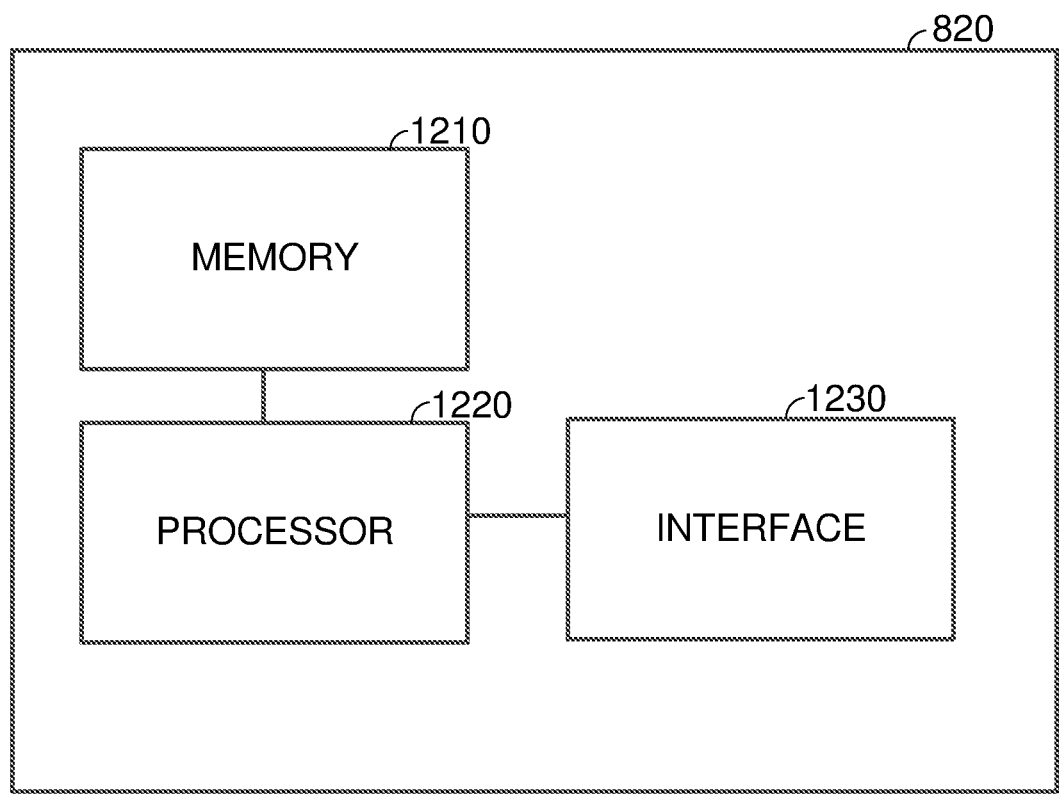
FIG. 12 shows an exemplary implementation of a controller according to certain aspects of the present disclosure.

In this regard, FIG. 12 shows an exemplary implementation of the controller 820 according to certain aspects of the present disclosure. In this example, the controller 820 includes a processor 1210, and a memory 1220 coupled to the processor 1210. The memory 1220 may store instructions that, when executed by the processor 1210, cause the processor 1210 to perform one or more of the operations described herein. Exemplary implementations of the processor 1210 are provided above. The memory 1220 may also be used to store one or more phase codes (e.g., in block 920). The controller 820 also includes an interface 1230 configured to interface the processor 1210 with the multiplexer 830, the CDR block 240, and/or other devices.

It is to be appreciated that the present disclosure is not limited to the exemplary terminology used to describe aspects of the present disclosure. For example, a phase code may also be referred to as a CDR code, a phase interpolator (PI) code or another term. In another example, freezing may also be referred to as disabling or another term. In yet another example, early and late may also be referred to as up (UP) and down (DN) or other terms.

It is to be appreciated that returning to an initial lock position does not require that the CDR circuit 210 return to the exact same initial phase position (initial phase code). Returning to an initial lock position also includes the CDR circuit 210 moving to a phase position (phase code) close to the initial phase position (e.g., within one to three phase steps of the initial phase code).

It is to be appreciated that phase position of the CDR circuit 210 may refer to the phase position of clock signal clk_i, in which the CDR circuit 210 is in a good lock position when the sampling edge of the clock signal clk_i is approximately located in the middle of the data eye (illustrated in FIG. 1A), and the CDR circuit 210 is in a bad lock position when the clock signal clk_i is approximately aligned with the data signal (illustrated in FIG. 1D).

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two components. The term "approximately" means within 15 degrees of the stated phase position.

It is to be understood that present disclosure is not limited to the specific order or hierarchy of steps in the methods disclosed herein. Based upon design preferences, it is understood that the specific order or hierarchy of steps in the methods may be rearranged. The accompanying method claims present elements of the various steps in a sample order, and are not meant to be limited to the specific order or hierarchy presented unless specifically recited therein.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:

1. A method for fixing a dead-zone in a clock and data recovery (CDR) circuit, wherein the CDR circuit includes a CDR block and a phase interpolator, the CDR block is configured to generate phase codes based on signals from a phase detector, and the phase interpolator is configured to adjust a phase of a clock signal based on the phase codes, the method comprising:
    waiting for the CDR circuit to lock;
    reading a first phase code from the CDR block;
    changing the first phase code by a first amount to obtain a second phase code; and
    inputting the second phase code to the phase interpolator.

2. The method of claim 1, wherein the first amount corresponds to a phase shift between 20 degrees and 90 degrees.

3. The method of claim 1, wherein the signals from the phase detector indicate whether the clock signal is early or late with respect to a data signal.

4. The method of claim 1, further comprising:
    freezing the CDR block before reading the first phase code from the CDR block; and
    unfreezing the CDR block after inputting the second phase code to the phase interpolator.

5. The method of claim 1, further comprising:
    after inputting the second phase code to the phase interpolator, waiting for the CDR circuit to lock;
    reading a third phase code from the CDR block;
    determining a first difference between the first phase code and the third phase code; and
    comparing a magnitude of the first difference with a threshold.

6. The method of claim 5, further comprising:
    if the magnitude of the first difference is greater than the threshold, changing the third phase code by a second amount to obtain a fourth phase code; and
    inputting the fourth phase code to the phase interpolator.

7. The method of claim 6, wherein the first amount and the second amount are the same.

8. The method of claim 6, further comprising:
    after inputting the fourth phase code to the phase interpolator, waiting for the CDR circuit to lock;
    reading a fifth phase code from the CDR block;
    determining a second difference between the third phase code and the fifth phase code; and comparing a magnitude of the second difference with the threshold.

9. The method of claim 5, further comprising:
if the magnitude of the first difference is equal to or less than the threshold, changing the third phase code by a second amount to obtain a fourth phase code, wherein the second amount is in an opposite direction from the first amount; and
inputting the fourth phase code to the phase interpolator.

10. The method of claim 9, wherein a magnitude of the second amount is approximately equal to half a magnitude of the first amount.

11. The method of claim 9, further comprising:
after inputting the fourth phase code to the phase interpolator, waiting for the CDR circuit to lock;
reading a fifth phase code from the CDR block;
determining a second difference between the third phase code and the fifth phase code; and
comparing a magnitude of the second difference with the threshold.

12. A circuit for fixing a dead-zone in a clock and data recovery (CDR) circuit, wherein the CDR circuit includes a CDR block and a phase interpolator, the CDR block is configured to generate phase codes based on signals from a phase detector, and the phase interpolator is configured to adjust a phase of a clock signal based on the phase codes, the circuit comprising:
a controller; and
a multiplexer configured to selectively couple the CDR block or the controller to the phase interpolator;
wherein the controller is configured to:
instruct the multiplexer to couple the CDR block to the phase interpolator and wait for the CDR circuit to lock;
read a first phase code from the CDR block;
change the first phase code by a first amount to obtain a second phase code;
instruct the multiplexer to couple the controller to the phase interpolator and input the second phase code to the phase interpolator; and
instruct the multiplexer to couple the CDR block to the phase interpolator after the second phase code is input to the phase interpolator.

13. The circuit of claim 12, wherein the first amount corresponds to a phase shift between 20 degrees and 90 degrees.

14. The circuit of claim 12, wherein the signals from the phase detector indicate whether the clock signal is early or late with respect to a data signal.

15. The circuit of claim 12, wherein the controller is configured to:
freeze the CDR block before reading the first phase code from the CDR block; and
unfreeze the CDR block after inputting the second phase code to the phase interpolator.

16. The circuit of claim 12, wherein the controller is configured to:
wait for the CDR circuit to lock after the second phase code is input to the phase interpolator;
read a third phase code from the CDR block;
determine a first difference between the first phase code and the third phase code; and
compare a magnitude of the first difference with a threshold.

17. The circuit of claim 16, wherein the controller is configured to:

if the magnitude of the first difference is greater than the threshold, change the third phase code by a second amount to obtain a fourth phase code; and
instruct the multiplexer to couple the controller to the phase interpolator and input the fourth phase code to the phase interpolator.

18. The circuit of claim 17, wherein the first amount and the second amount are the same.

19. The circuit of claim 17, wherein the controller is configured to:
instruct the multiplexer to couple the CDR block to the phase interpolator after the fourth phase code is input to the phase interpolator and wait for the CDR circuit to lock;
read a fifth phase code from the CDR block;
determine a second difference between the third phase code and the fifth phase code; and
compare a magnitude of the second difference with the threshold.

20. The circuit of claim 16, wherein the controller is configured to:
if the magnitude of the first difference is equal to or less than the threshold, change the third phase code by a second amount to obtain a fourth phase code, wherein the second amount is in an opposite direction from the first amount; and
instruct the multiplexer to couple the controller to the phase interpolator and input the fourth phase code to the phase interpolator.

21. The circuit of claim 20, wherein a magnitude of the second amount is approximately equal to half a magnitude of the first amount.

22. The circuit of claim 20, wherein the controller is configured to:
instruct the multiplexer to couple the CDR block to the phase interpolator after the fourth phase code is input to the phase interpolator and wait for the CDR circuit to lock;
read a fifth phase code from the CDR block;
determine a second difference between the third phase code and the fifth phase code; and
compare a magnitude of the second difference with the threshold.

23. A circuit for fixing a dead-zone in a clock and data recovery (CDR) circuit, wherein the CDR includes a CDR block and a phase interpolator, the circuit comprising:
a controller configured to:
read a first phase code from the CDR block;
change the first phase code by an amount to obtain a second phase code; and
output the second phase code at an output of the controller; and
a multiplexer having a first input coupled to an output of the CDR block, a second input coupled to the output of the controller, and an output coupled to an input of the phase interpolator, wherein the multiplexer is configured to:
receive a select signal; and
couple the output of the CDR block to the input of the phase interpolator or couple the output of the controller to the input of the phase interpolator based on the select signal.

24. The circuit of claim 23, wherein the amount corresponds to a phase shift between 20 degrees and 90 degrees.

25. The circuit of claim 23, wherein the multiplexer is configured to:

couple the output of the CDR block to the input of the phase interpolator when the select signal has a first logic value; and couple the output of the controller to the input of the phase interpolator when the select signal has a second logic value.

26. The circuit of claim 23, wherein the controller is configured to change the first phase code by the amount by adding or subtracting k phase steps from the first phase code.

* * * * *